(12) United States Patent
Aoki

(10) Patent No.: US 8,338,907 B2
(45) Date of Patent: Dec. 25, 2012

(54) SEMICONDUCTOR DEVICE AND METHOD OF MANUFACTURING THE SAME

(75) Inventor: Hironori Aoki, Niiza (JP)

(73) Assignee: Sanken Electric Co., Ltd., Niiza-shi (JP)

(*) Notice: Subject to any disclaimer, the term of this patent is extended or adjusted under 35 U.S.C. 154(b) by 0 days.

(21) Appl. No.: 13/355,036

(22) Filed: Jan. 20, 2012

(65) Prior Publication Data

US 2012/0119319 A1 May 17, 2012

Related U.S. Application Data

(63) Continuation of application No. 12/234,945, filed on Sep. 22, 2008, now Pat. No. 8,125,022.

(30) Foreign Application Priority Data

Oct. 2, 2007 (JP) ................................. 2007-258743

(51) Int. Cl.
*H01L 29/06* (2006.01)

(52) U.S. Cl. ........ 257/493; 257/328; 257/329; 257/341; 257/355; 257/E29.012

(58) Field of Classification Search .................. 257/328, 257/329, 341, 355, 493, E29.012
See application file for complete search history.

(56) References Cited

U.S. PATENT DOCUMENTS

| | | | |
|---|---|---|---|
| 5,801,418 A | 9/1998 | Ranjan | |
| 7,335,949 B2* | 2/2008 | Ninomiya et al. | 257/341 |
| 7,554,155 B2 | 6/2009 | Saito et al. | |
| 7,638,841 B2* | 12/2009 | Challa | 257/341 |
| 2004/0058481 A1* | 3/2004 | Xu et al. | 438/135 |
| 2004/0188775 A1* | 9/2004 | Peake et al. | 257/397 |
| 2005/0161723 A1 | 7/2005 | Higuchi | |
| 2006/0033141 A1 | 2/2006 | Okazaki et al. | |
| 2007/0052015 A1* | 3/2007 | Miura et al. | 257/331 |
| 2008/0006866 A1* | 1/2008 | Lee | 257/301 |
| 2010/0244183 A1 | 9/2010 | Aoki et al. | |

* cited by examiner

*Primary Examiner* — Matthew W Such
*Assistant Examiner* — David Spalla
(74) *Attorney, Agent, or Firm* — Oblon, Spivak, McClelland, Maier & Neustadt, L.L.P.

(57) ABSTRACT

A semiconductor device includes a first semiconductor region and a second semiconductor region provided on a main surface of a substrate, being apart from each other and having first conductivity; a third semiconductor region provided between the first semiconductor region and the second semiconductor region and having second conductivity opposite to the first conductivity; a fourth semiconductor region provided on a main surface of the substrate, connected to the third semiconductor region, manufactured together with the third semiconductor region in the same manufacturing process, and having the conductivity same as that of the third semiconductor region; and trenches made on the main surface of the fourth semiconductor region and having a depth smaller than a junction depth of the fourth semiconductor region.

5 Claims, 15 Drawing Sheets

SEMICONDUCTOR DEVICE AND METHOD OF MANUFACTURING THE SAME

CROSS REFERENCE TO RELATED APPLICATION

This application is a continuation of and claims the benefit of priority under 35 U.S.C. §120 from U.S. Ser. No. 12/234,945, filed Sep. 22, 2008, which is based upon and claims the benefit of priority from the prior Japanese Patent Application No. 2007-258743 filed on Oct. 2, 2007. The entire contents of both references are incorporated herein by reference.

BACKGROUND OF THE INVENTION

1. Field of the Invention

This invention relates to a semiconductor device and a method of manufacturing the same, and more particularly relates to an electric power semiconductor device having a high withstand voltage structure, and a method of manufacturing the same.

2. Description of the Related Art

Development of electric power semiconductor devices including high withstand voltage structures is in progress. Such a high withstand voltage structure often includes a power MOSFET (metal oxide semiconductor field effect transistor). With the foregoing electric power semiconductor device, a withstand voltage at a peripheral area of an element area of a substrate is designed to be higher than a withstand voltage at the element area of the substrate where the power MOSFET is arranged. A RESURF (reduced surface field) structure is used at the peripheral area of the substrate.

With the RESURF structure, when a reverse bias is applied, a depletion layer extends from the element area to the periphery thereof in order to improve the withstand voltage. The semiconductor device having the RESURF structure can realize a high withstand voltage in a relatively small space compared with a semiconductor device having the FLR structure. In other words, the RESURF structure can improve an integration degree of the electric power semiconductor device.

In the power MOSFET, an n type epitaxial layer on an n type silicon single crystal substrate is used as a drain region, a p type body layer is placed on the drain region, and an n type source region is formed on the p type body layer. A gate insulating film is formed on the p type body layer, and a gate electrode is formed on the gate insulating film. A RESURF layer having the RESURF structure is constituted by the p type semiconductor region on the n type epitaxial layer.

U.S. Pat. No. 5,801,418 discloses one example of electric power semiconductor devices having the RESURF structure.

Electric power semiconductor devices of the related art seem to suffer from the following problems. In the electric power semiconductor device having the withstand voltage structure, a density of impurities in an n type epitaxial layer is designed to be low compared with a density of impurities in a p type body layer. In order to balance charges in the n type epitaxial layer and the p type body layer, a density of impurities in a RESURF layer (p type semiconductor region) having the RESURF structure is designed to be low. In other words, the RESURF layer and the p type body layer of the power MOSFET cannot be produced in the same manufacturing process. Therefore, in the semiconductor device manufacturing process, the RESURF layer is manufactured in a process separate from a p type body layer manufacturing process. Further, if a front (upper) surface of the RESURF layer undergoes metallic contamination, a junction depth of the RESURF layer should be designed to be somewhat large in order to prevent a precipitous decrease of balances of charges which are stored on longitudinal vertical section of the n type epitaxial layer and the p type body layer. For this purpose, an additional diffusion process is required at a high temperature and for long hours in the RESURF layer manufacturing process in order to accomplish a sufficient junction depth. Addition of such a hot and long diffusion process may inevitably increase a manufacturing cost of the electric power semiconductor device.

SUMMARY OF THE INVENTION

The present invention has been contemplated in order to overcome problems of the related art, and is aimed at providing a semiconductor device which includes a RESURF structure for accomplishing a high withstand voltage and a method of manufacturing the semiconductor device having the RESURF structure without requiring an additional diffusion process at a high temperature and for long hours. Further, the invention is intended to provide a semiconductor device at a reduced manufacturing cost, and a method of manufacturing the same.

According to a first aspect of the embodiment of the invention, there is provided a semiconductor device which includes: a semiconductor element area positioned at the central area of a substrate, including not only a first semiconductor region and a second semiconductor region which have first conductivity and are apart from each other but also a third semiconductor region placed between the first and second semiconductor regions, exposed on a main surface of the substrate, and having second conductivity opposite to the first conductivity; a fourth semiconductor region exposed on the main surface of the substrate away from the central area of the substrate, electrically connected to the third semiconductor region, manufactured under the condition same as that of the third semiconductor region, and having the conductivity same as that of the third semiconductor region; and trenches formed into the surface of the fourth semiconductor region and having a depth smaller than a junction depth of the fourth semiconductor region.

In the foregoing semiconductor device, a dielectric is preferably filled in the trenches. Further, the trenches preferably extend in a first direction for an end of the substrate from the central area of the substrate, and are in the shape of a plurality of planar stripes arranged in a second direction which intersects with the first direction. Still further, the trenches preferably extend in the second direction which intersects with the first direction for an end of the substrate from the central area of the substrate, and are in the shape of a plurality of planar stripes arranged in the first direction. Alternatively, the trenches extend in the first direction, and are in the shape of a plurality of planar dots arranged in the second direction. The trenches are preferably packed together near the semiconductor element area compared with near the end of the substrate. Further, the trenches are packed together near the end of the substrate compared with near the semiconductor element area.

In accordance with a second aspect of the embodiment of the invention, there is provided a semiconductor device including: a first semiconductor region and a second semiconductor region provided on a substrate, being apart from each other, and having first conductivity; a third semiconductor region provided between the first and second semiconductor regions, exposed on a main surface of the substrate, and having second conductivity opposite to the first conductivity; an electrode provided on the first semiconductor region and exposed on the main surface of the substrate outside the third semiconductor region; a fourth semiconductor region provided between the first semiconductor region having an electrode thereon and the second semiconductor region, exposed on the main surface of the substrate, manufactured under the condition same as that of the third semiconductor region, and having the conductivity same as that of the third semiconductor region; and trenches made in the fourth semiconductor region and having a depth smaller than a junction depth between the main surface of the substrate and the fourth semiconductor region.

In the semiconductor devices having the first and second features, a total amount of charges of the fourth semiconductor region under the trenches and a total amount of charges of the substrate under the trenches and at a longitudinal cross-sectional area of the substrate are equal.

According to a third aspect of the embodiment of the invention, there is provided a method of manufacturing a semiconductor device. The method includes: making a semiconductor element area, the semiconductor element area including not only first and second semiconductor regions provided at the central area of a substrate which are apart from each other and have first conductivity but also a third semiconductor region provided between the first and second semiconductor regions, exposed on a main surface of the substrate, and having second conductivity opposite to the first conductivity: making a fourth semiconductor region exposed on the main surface of the substrate away from the central area of the substrate, electrically connected to the third semiconductor region, manufactured under the condition same as that of the third semiconductor region, and having the conductivity same as that of the third semiconductor region; and making trenches into the surface of the fourth semiconductor region, the trenches having a depth smaller than a junction depth of the fourth semiconductor region.

As described above, the invention provides a semiconductor device which has a somewhat large junction depth without carrying out a hot and long diffusion process independently from a p type body layer, includes the RESURF structure accomplishing high withstand voltage performance, and assures reliable operations. Further, the invention provides the method of manufacturing the semiconductor device at a reduced cost.

DETAILED DESCRIPTION OF THE INVENTION

Figure 1:
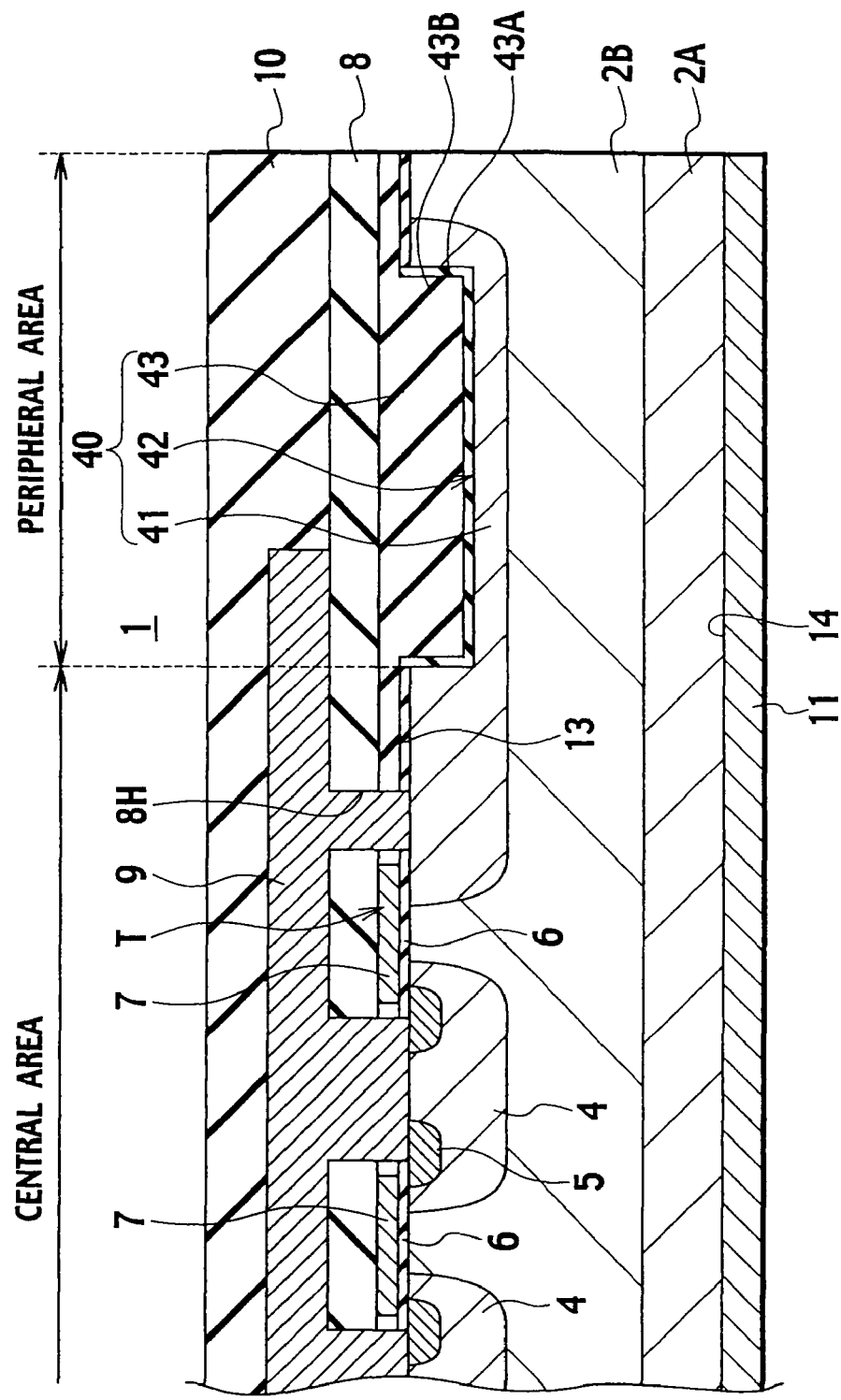
FIG. 1 is a cross sectional view of an essential part of a semiconductor device according to a first embodiment of the invention.

The invention will be described with reference to some embodiments shown on the drawings. Like or corresponding parts are denoted by like or corresponding reference numbers. The drawing figure schematically show components, which may sometimes differ from actual components. Further, some drawing figures may differ in scales or sizes.

While the invention herein disclosed has been described by means of specific examples and applications thereof, numerous modifications and variations could be made thereto without departing from the scope of the invention set forth in the claims.

(First Embodiment)

In a first embodiment, the invention is applied to an electric power semiconductor device in which a power MOSFET is provided.

[Configuration of Semiconductor Device]

Figure 2:
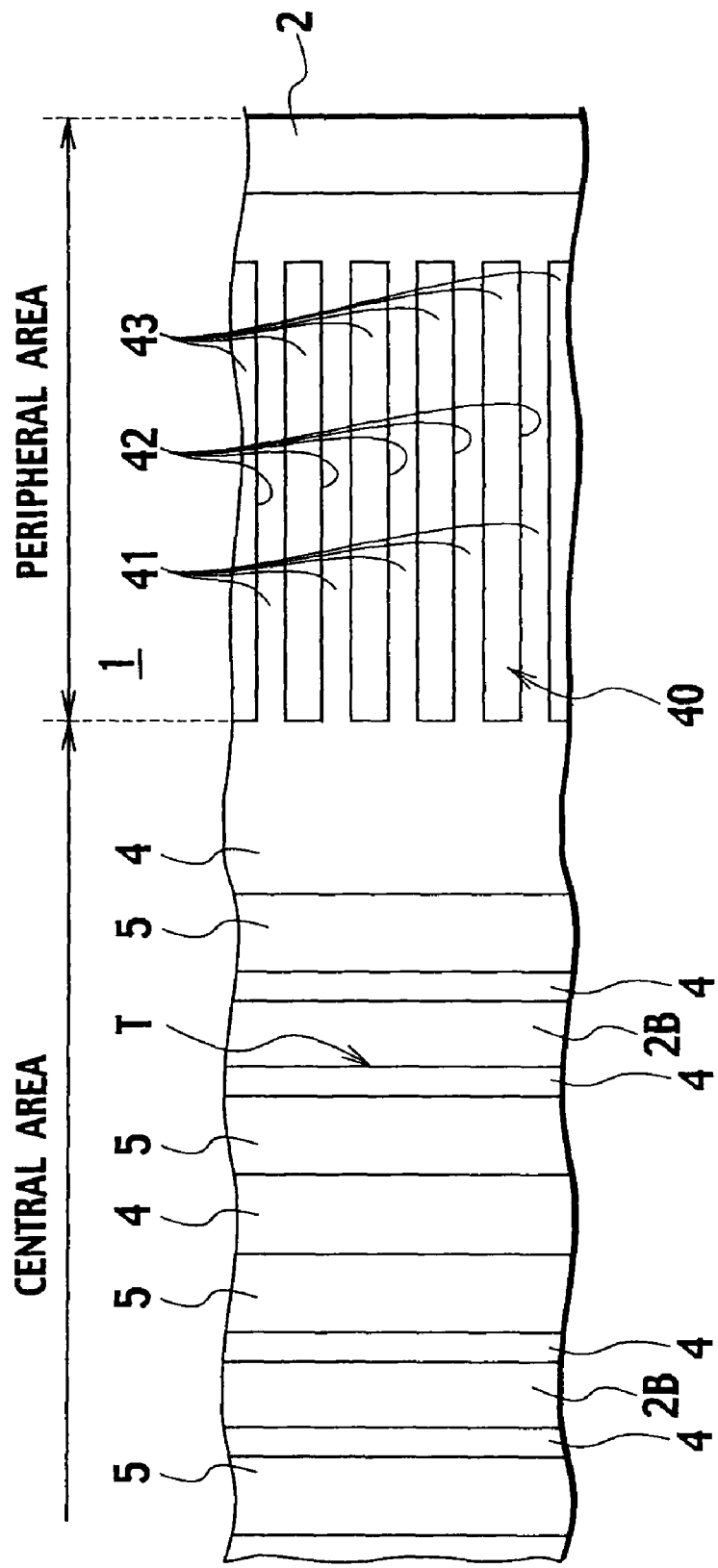
FIG. 2 is a top plan view of the essential part of the semiconductor device in FIG. 1.

Referring to FIG. 1 and FIG. 2, a semiconductor device 1 of the first embodiment includes: a first semiconductor region 2B and a second semiconductor region 5 which are located at the central area of a substrate 2, are apart from each other, and exhibits first conductivity; a semiconductor element area including a third semiconductor region 4 which is provided between the first semiconductor region 2B and the semiconductor region 5, is exposed on a main surface of the substrate 2, and exhibits second conductivity opposite to the first conductivity; a fourth semiconductor region 41 which is exposed on a peripheral area of the main surface from the central area of the substrate 2, is electrically connected to the third semiconductor region 4, is configured similarly to the third semiconductor region 4 (having a junction depth same as that of the third semiconductor region 4) and exhibits the conductivity same as that of the third semiconductor region 4; and trenches 42 which are dug in the main surface of the fourth semiconductor region 41 and have a depth smaller than the junction depth.

In this embodiment, the substrate 2 includes an n type silicon single crystal substrate 2A (called the "fifth semiconductor region"), and a first semiconductor region 2B which undergoes epitaxial growth on the n type silicon single crystal substrate 2A or which is formed by diffusing impurities onto the main surface of the substrate 2. A density of the impurities in the first semiconductor region 2B is smaller than that of the n type silicon single crystal substrate 2A.

One transistor T is (or a plurality of transistors T are) provided on the semiconductor element area. The transistor T is a vertical and high withstand voltage power MOSFET. The first semiconductor region 2B of the transistor T is practically constituted by an n type semiconductor substrate, and functions as an n type well region. The fifth semiconductor region 2A functions as a drain region. The third semiconductor region 4 includes a p type semiconductor region which is island-shaped on an inner surface of the first n type semiconductor region 2B, and functions as a p type body layer (or a p type base region). The second semiconductor region 5 includes an n type semiconductor region which is island-shaped on an inner surface of the third semiconductor region 4, and functions as a source region. A density of impurities in the second semiconductor region 5 is higher than a density of impurities in the first semiconductor region 2B. In the first practical example, the "first conductivity" is n type while the "second conductivity" is p type.

Further in the transistor T, a gate insulating film 6 is present on an exposed area of one main surface (upper surface) of the substrate 2 of the third semiconductor region 4. A gate electrode 7 is provided on the gate insulating film 6. In this embodiment, the gate insulating film 6 is a silicon oxide film. Further, the gate insulating film 6 may be any insulating film, e.g., a silicon nitride film, a single layer of an oxy-nitride film, two or more stacked layers of different films such as silicon oxide films, silicon nitride films and so on. When the gate insulating film 6 is made of an insulating film other than the silicon oxide film, the transistor T will be a high withstand voltage MISFET (metal insulator semiconductor field effect transistor). The gate electrode 7 is practically made of a silicon polycrystalline film, a conductive film such as a refractory metal film, and so on.

The peripheral area of the substrate 2 (near an end of the substrate 2 outside the semiconductor element area) includes the fourth semiconductor region 41 used as the RESURF layer, a plurality of trenches 42, and a dielectric 43 (e.g. an insulant) 43 buried in the trenches 42. The fourth semiconductor region 41 has the conductivity (p type) same as that of the third semiconductor region 4 of the transistor T, and is in the shape of islands on the inner surface of the first semiconductor region 2B together with the third semiconductor region 4. In other words, the fourth semiconductor region 41 and the third semiconductor region 4 are made in the same manufacturing process of the semiconductor device, and have the substantially equal density of impurities and junction depth. The fourth semiconductor region 41 is electrically connected to the third semiconductor region 4 via the source electrode 9 as shown in FIG. 1.

At the peripheral area of the substrate 2, the trenches 42 extend in the first direction (laterally in FIG. 2) from the central area to the end of the substrate 2, and are in the shape of planar stripes arranged in the second direction (longitudinally in FIG. 2) which intersects the first direction. Referring to FIG. 2, the trenches 42 are longitudinally narrow but laterally very long, when observed from above, and are longitudinally arranged at certain intervals. If the trenches 42 are wide, it is very difficult to bury the dielectric 43 in them. This means that the dielectric material 43 should be thick enough. The dielectric 43 can be securely buried in the narrow and long trenches 42 mainly via long sides thereof.

An interlayer dielectric 8 is disposed not only between the gate electrode 7 and the source electrode 9 which are exposed on one main surface section of the substrate 2 but also on the dielectric 43. The interlayer dielectric 8 has a connection hole 8H on the second semiconductor region 5. The source electrode 9 is placed on the interlayer dielectric 8 and is electrically connected to the second semiconductor region 5 and the third semiconductor region 4 via the connection hole 8H. The source electrode 9 is practically made of an aluminum alloy wiring, for instance. Referring to FIG. 1, the source electrode 9 on the interlayer dielectric 8 extends to the peripheral area of the trenches 42 beyond the central area of the substrate 2. When observed from above, it is preferable that the trenches 42 are formed under the source electrode 9 via the interlayer dielectric 8 and the dielectric 43, which prevents the reliability from being lowered by external ions. Further, a drain electrode 11 is made substantially all over the other main surface section (lower surface) of the substrate 2. A protective film 10 is placed over the source electrode 9.

Referring to FIG. 1, when a given voltage is applied across the drain electrode 11 and the source electrode 9, a depletion layers appears at a pn junction at an interface between the third semiconductor region 4 and the fourth semiconductor region 41, and the first semiconductor region 2B. Not only the depth of the trenches 42 but also planar structures of the trenches 42 and the fourth semiconductor region 41 are determined in order that an absolute value of a total amount of charges accumulated at the fourth semiconductor region 41 just under the trenches 42 and an absolute value of a total amount of charges accumulated at the first semiconductor region 2B are substantially equal (in a range where charge balances can be accomplished). In other words, the total amount of charges of the fourth semiconductor region 41 under the trenches 42 is smaller than the total amount of charges of the third semiconductor 4 which is made together with the fourth semiconductor region 41 in the same manufacturing process. The total amounts of accumulated charges are in proportion to the densities of impurities. Therefore, the fourth semiconductor region 41 under the trenches 42 functions to promote spreading of the depletion layer similarly to RESURF layers of the related art, and improves high withstand voltage performance.

[High Withstand Voltage Performance of High Withstand Voltage Section]

The high withstand voltage section 40 has been confirmed to withstand approximately 660V through simulations under the following conditions:
1. Density of impurities of n type silicon single crystal substrate 2A: $2.2 \times 10^{18}$ atoms/cm$^3$
2. Density of impurities of first semiconductor region 2B: $2.75 \times 10^{14}$ atoms/cm$^3$
3. Thickness of first semiconductor region 2B: 49 μm
4. Density of impurities in fourth semiconductor region (and third semiconductor region 4): $1.5 \times 10^{17}$ atoms/cm$^3$
5. Junction depth of fourth semiconductor region (and third semiconductor region 4): 3 μm
6. Depth of trenches 42: 1.5 μm

[Semiconductor Device Manufacturing Method]

A method of manufacturing the semiconductor device 1 will be briefly described with reference to FIG. 3 to FIG. 10.

Figure 3:
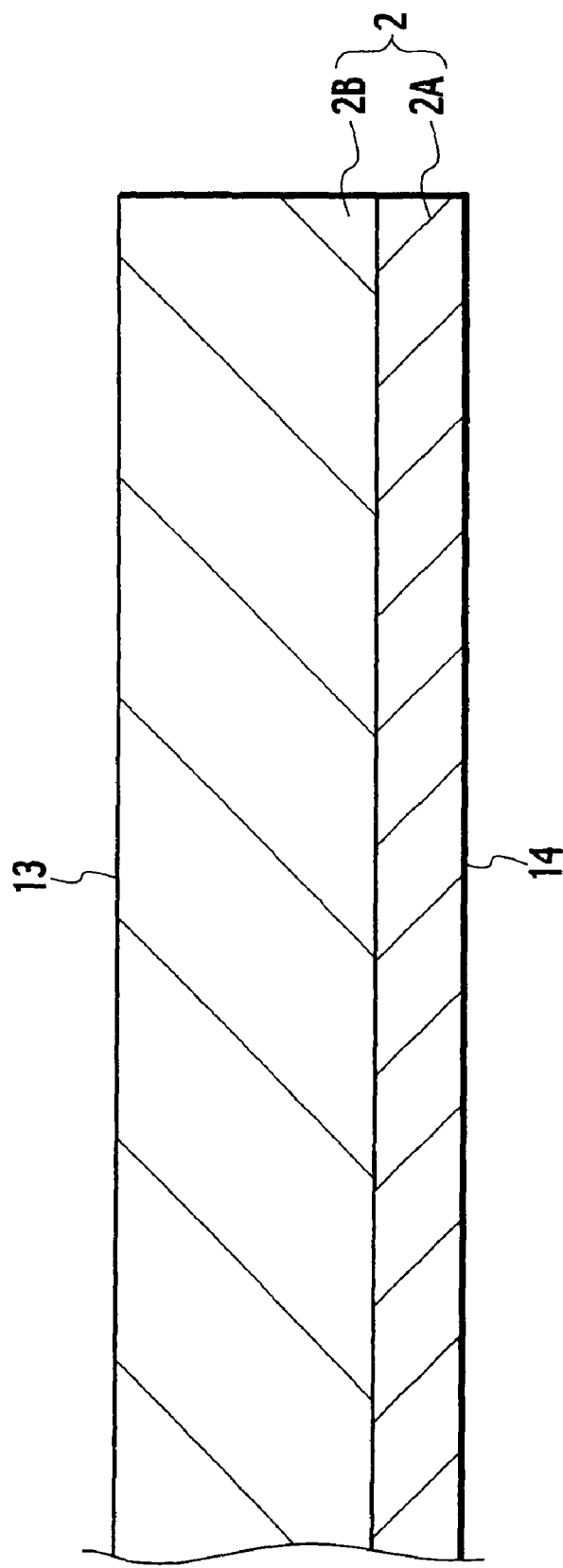
FIG. 3 is a cross sectional view showing how the semiconductor device in FIG. 1 is made in a first manufacturing process.

First of all, the fifth semiconductor region 2A is prepared (refer to FIG. 3). The fifth semiconductor region 2A is 625 μm thick, for instance, and has a density of impurities of $2.2 \times 10^{18}$ atoms/cm$^3$, for instance. The first semiconductor region 2B is made on the fifth semiconductor region 2A by the epitaxial growth or impurity diffusion. The first semiconductor region 2B is has a thickness of 49 μm, and an impurity density of $2.75 \times 10^{14}$ atoms/cm$^3$. Thus, the substrate 2 having the fifth semiconductor region 2A and the first semiconductor region 2B is completed.

Figure 4:
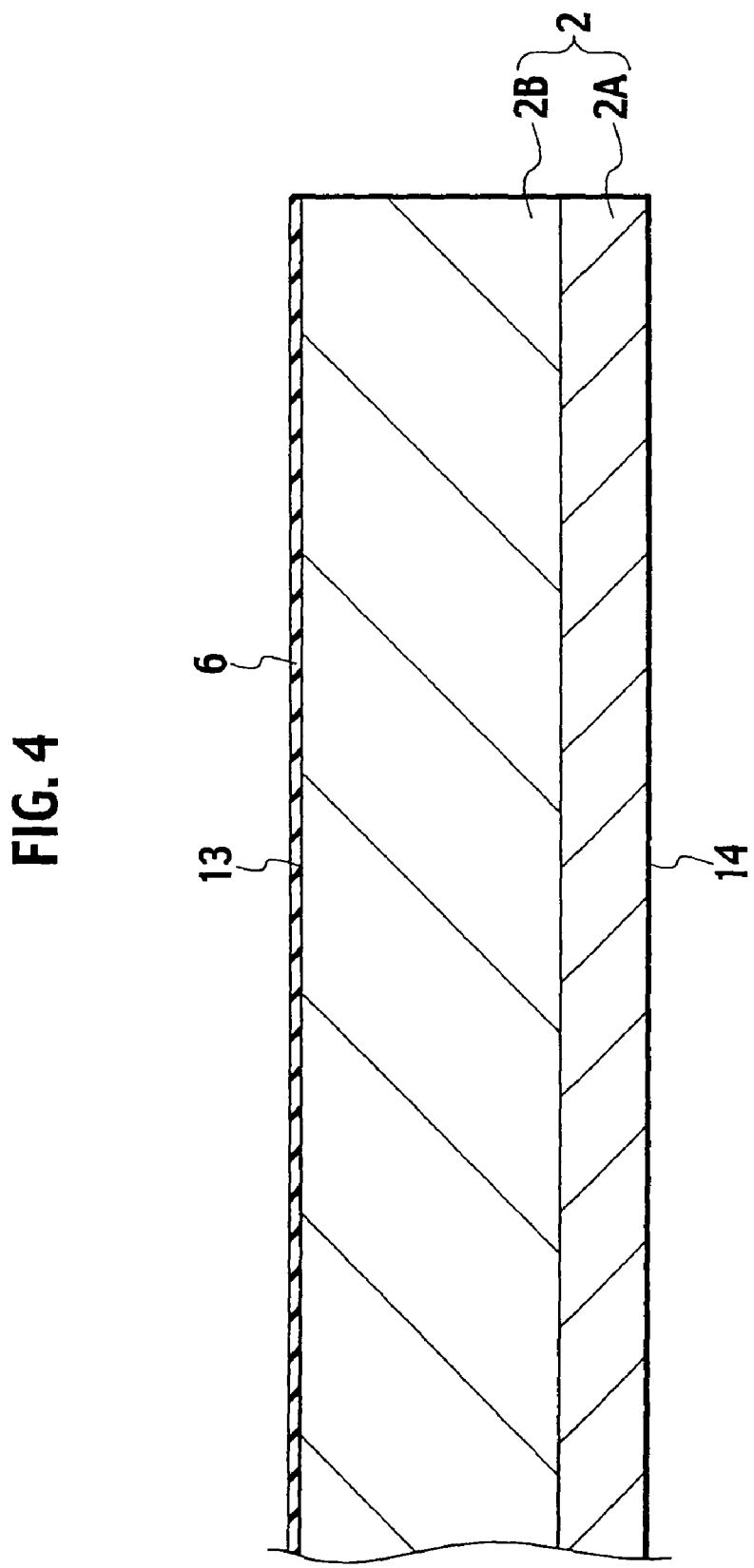
FIG. 4 is a cross sectional view showing how the semiconductor device is made in a second manufacturing process.

As shown in FIG. 4, the gate insulating film 6 covers substantially all over one main surface section 13 of the substrate 2. A silicon oxide film prepared by the thermal oxidation is practically used as the gate insulating film 6, for instance. The gate insulating film 6 is thick 100 nm, for instance.

Figure 5:
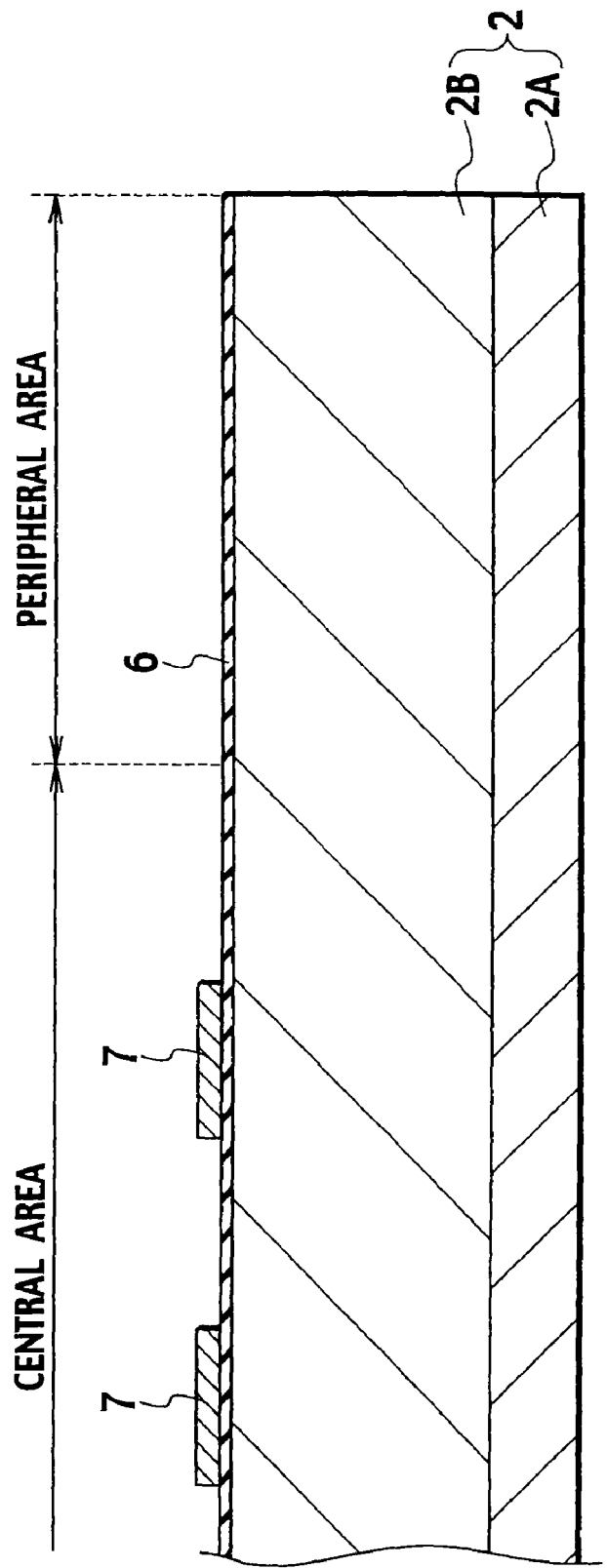
FIG. 5 is a cross sectional view showing how the semiconductor device is made in a third manufacturing process.

The gate electrode 7 is selectively made on the gate insulating film 6 as shown in FIG. 5. A silicon polycrystalline film with a thickness of approximately 550 nm is prepared by the CVD process, is doped by n type impurities, and is patterned, so that the transistor T is selectively made at the central area of the substrate 2. For instance, phosphoric acid P is used as the n type impurities, is applied into a dose amount of approximately $1.0\times10^{16}$ atoms/cm$^2$ by the ion implantation. Therefore, the n type impurities are annealed, so that n type impurities will be activated. A mask prepared by the photolithography is used for the patterning. The gate electrode 7 are dry-etched.

Figure 6:
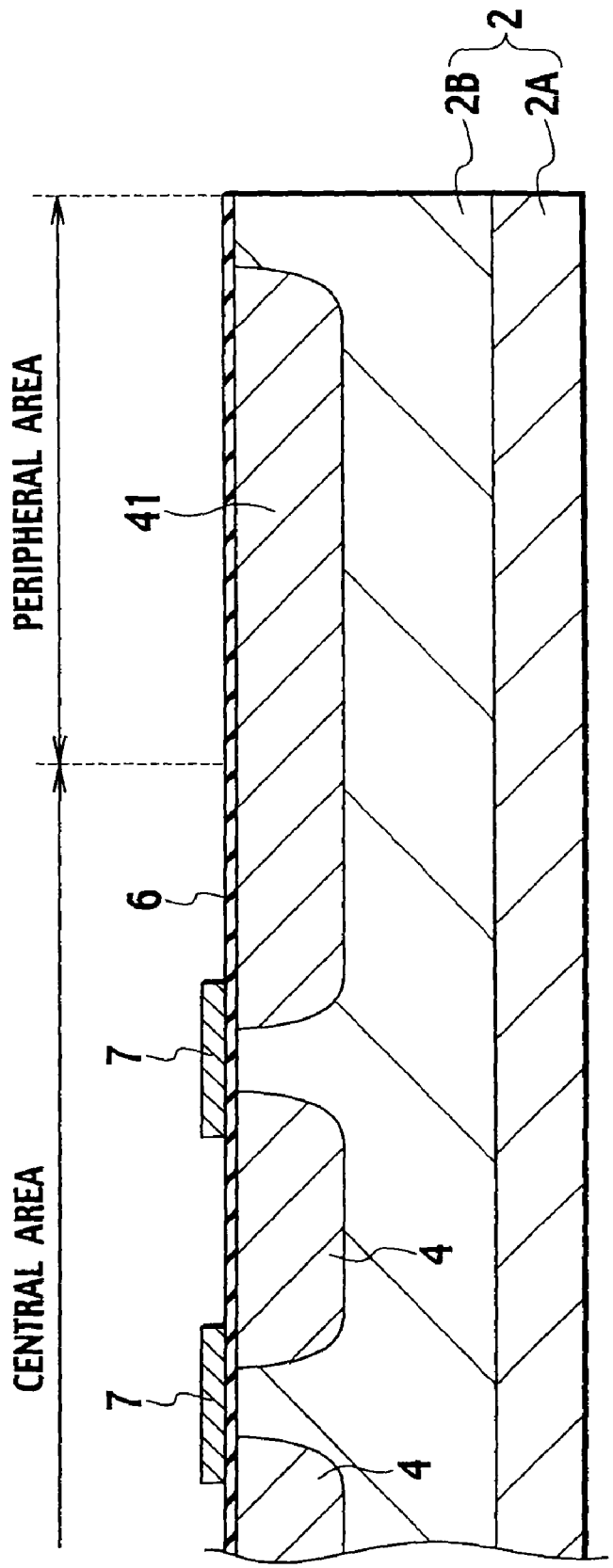
FIG. 6 is a cross sectional view showing how the semiconductor device is made in a fourth manufacturing process.

Referring to FIG. 6, the gate electrode 7 or a new resist mask (not shown) is used to make the third semiconductor region 4, which is exposed on the main surface 13 of the substrate 2, and is in the shape of an island in the first semiconductor region 2B. Simultaneously, the fourth semiconductor region 41 at the peripheral area 40 of the substrate 2 is made in the same manufacturing process. An impurity density of the fourth semiconductor region 41 is designed to be equal to an optimum impurity density of the third semiconductor region 41 mainly in view of attributes such as a threshold voltage and a tolerated dose. For instance, boron (B) is used as the p type impurities for the third semiconductor region 4 and the fourth semiconductor region 41, is applied into a dose amount of approximately $4.0\times10^{13}$ atoms/cm$^2$ by the ion implantation. Thereafter, the boron B is drive-diffused, and activated.

Figure 7:
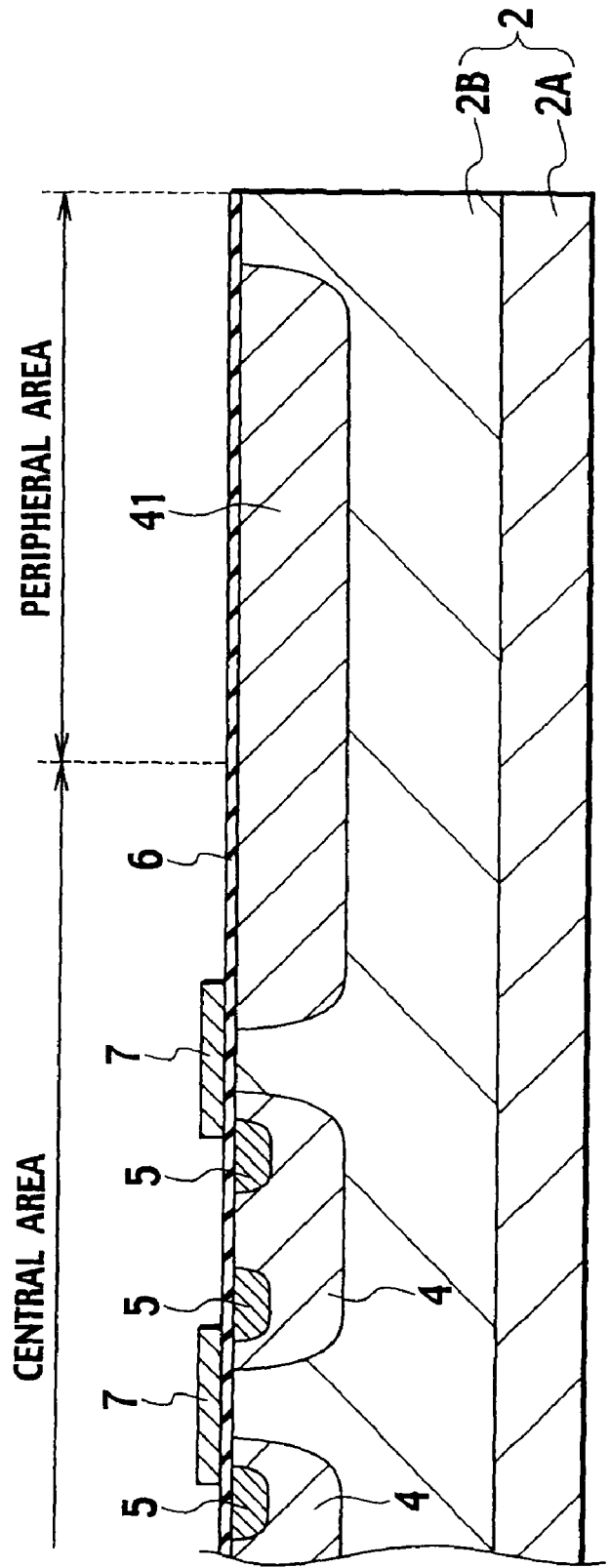
FIG. 7 is a cross sectional view showing how the semiconductor device is made in a fifth manufacturing process.

As shown in FIG. 7, the second semiconductor region 5 is made on one main surface section 13 of the substrate 2 using the gate electrode 7 and another new resist mask (not shown). Arsenic (As) is used as n type impurities, and is applied into a dose amount of approximately $1.0\times10^{16}$ atoms/cm$^2$ by the ion implantation. Thereafter, the arsenic (As) is drive-diffused, and is activated.

Figure 8:
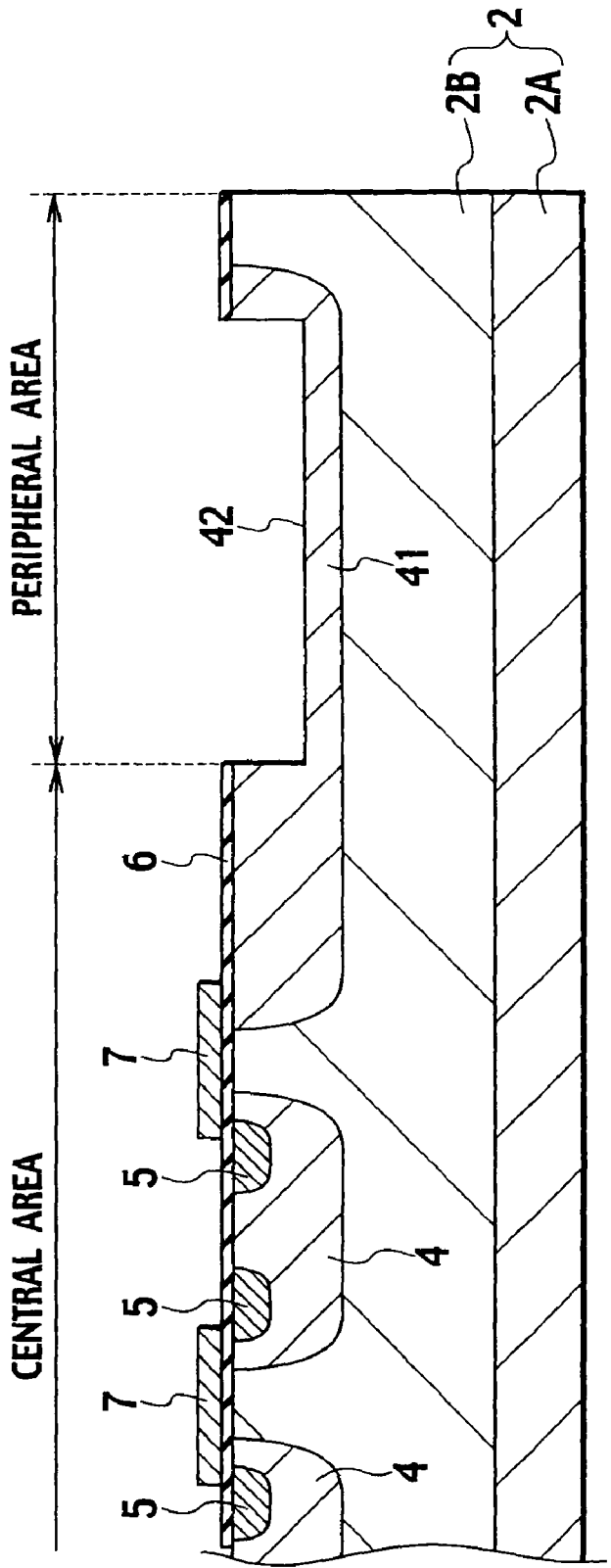
FIG. 8 is a cross sectional view showing how the semiconductor device is made in a sixth manufacturing process.

Referring to FIG. 8, the trenches 42 are made in the fourth semiconductor region 41 on the main surface section 13 of the substrate 2. The trenches 42 have a depth which is smaller than a junction depth of the pn junction with the fourth semiconductor region 41 and the first semiconductor region 2B. The trenches 42 are subject to the RIE anisotropic etching using another new resist mask (not shown), so that a surface of the second semiconductor region 41 is etched out. The trenches 42 are 1.5 µm deep.

Figure 9:
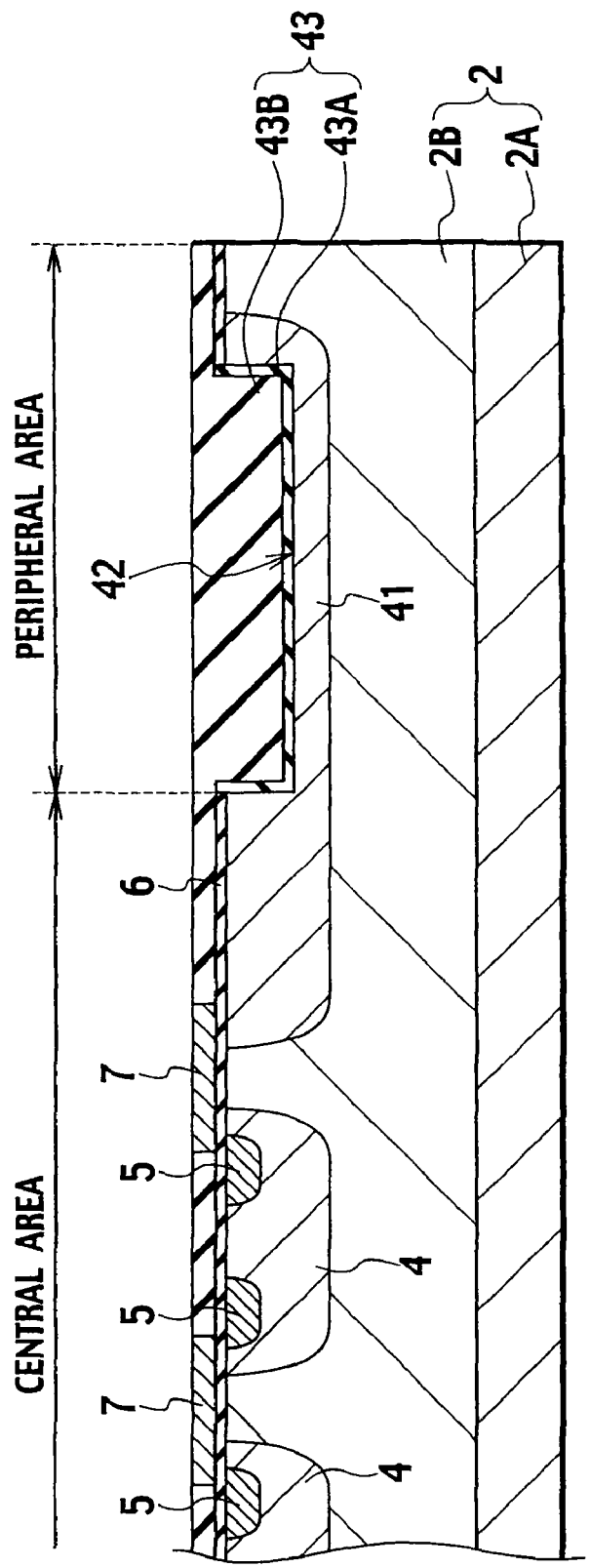
FIG. 9 is a cross sectional view showing how the semiconductor device is made in a seventh manufacturing process.

As shown in FIG. 9, the dielectric 43 filling the trenches 42 is made at the peripheral area 40 (called the "high withstand voltage section 40"). When making the dielectric 43, a silicon oxide film 43A is prepared and is applied onto the inner surfaces of the trenches 42 by the thermal oxidation. Further, a non-doped silicate glass (NSG:SiO$_2$) film 43B is made in order to fill the trenches 42. A surplus NSG film 43B is removed by the chemical mechanical polishing (CMP). Thus, the dielectric 43 is completed.

Figure 10:
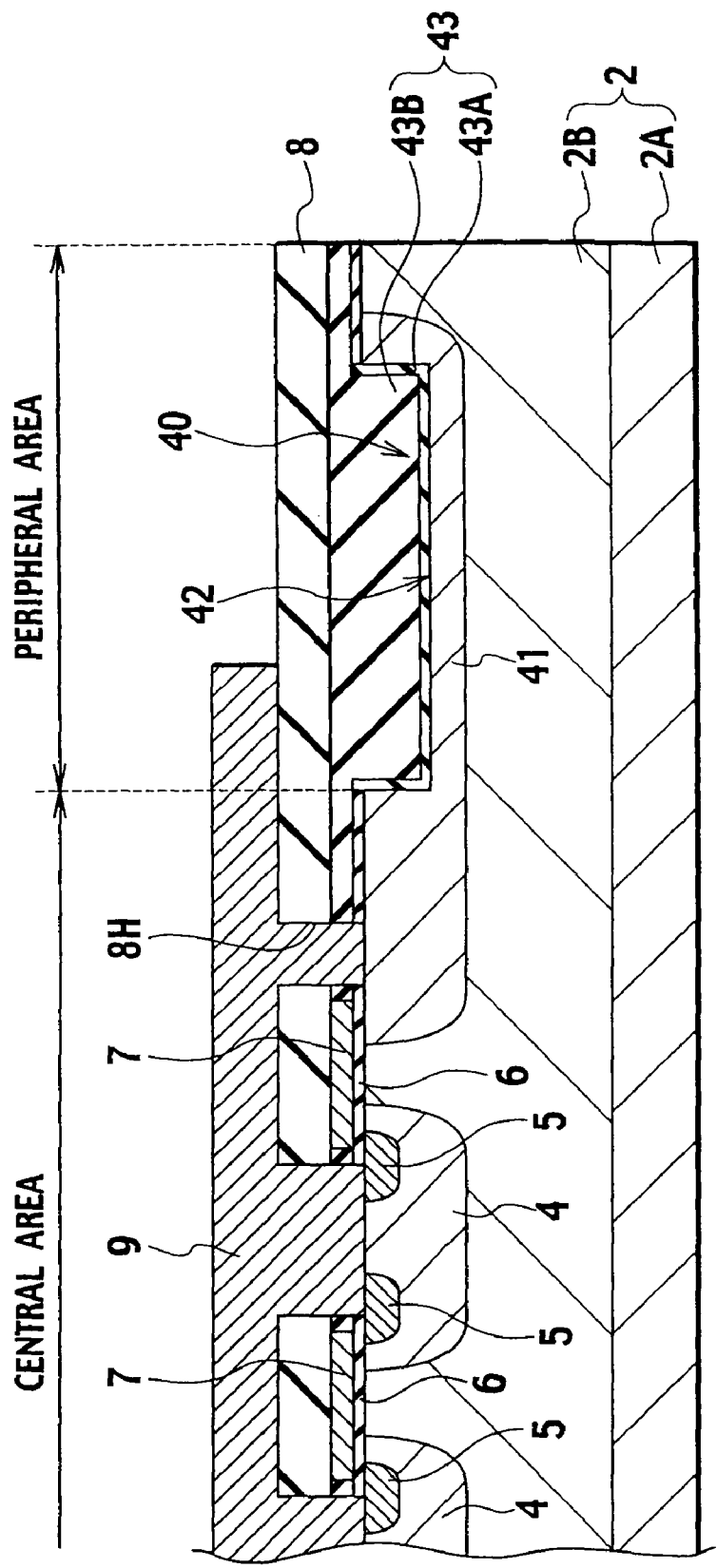
FIG. 10 is a cross sectional view showing how the semiconductor device is made in an eighth manufacturing process.

Then, the interlayer dielectric 8 is made (see FIG. 10). A phosphorous silicate glass (PSG) film is practically used for the interlayer dielectric 8. The connection hole 8H is made on the interlayer dielectric 8. The source electrode 9 is made on the interlayer dielectric 8. The semiconductor device 1 will be completed after a series of the foregoing processes.

In the semiconductor device 1 of the first embodiment, the high withstand voltage section 40 is mainly constituted by the third semiconductor region 4 of the transistor T, the fourth semiconductor region 41 and the trenches 42, all of which are flush with one another and have the first conductivity. Therefore, the RESURF layer assuring a high withstand voltage can be made without a hot and long diffusing process for the RESURF layer, compared with a case where the RESURF layer is made by a process different from the manufacturing process for the third semiconductor region 4. Therefore, a manufacturing cost of the semiconductor device 1 can be reduced.

Further, in the first embodiment, the trenches 42 are not wide but narrow and long, so that the dielectric 43 can be easily buried in the trenches 42.

Still further, even if the fourth semiconductor region 41 functioning as the RESURF layer undergoes metal contamination by external ions, especially by sodium ions or the like, the junction depth of the fourth semiconductor region 41 is as deep as the junction depth of the third semiconductor region 4. Therefore, it is possible to keep the balance between the charges in the fourth semiconductor region 41 and the first semiconductor region 2B. In other words, the semiconductor device 1 can be protected against voltage variations caused by the metal contamination.

(Second Embodiment)

In a second embodiment, the structure of the high withstand voltage section 40 of the semiconductor device 1 of the first embodiment is modified, and particularly a planar structure is modified.

[First Planar Structure of High Withstand Voltage Section]

Figure 11:
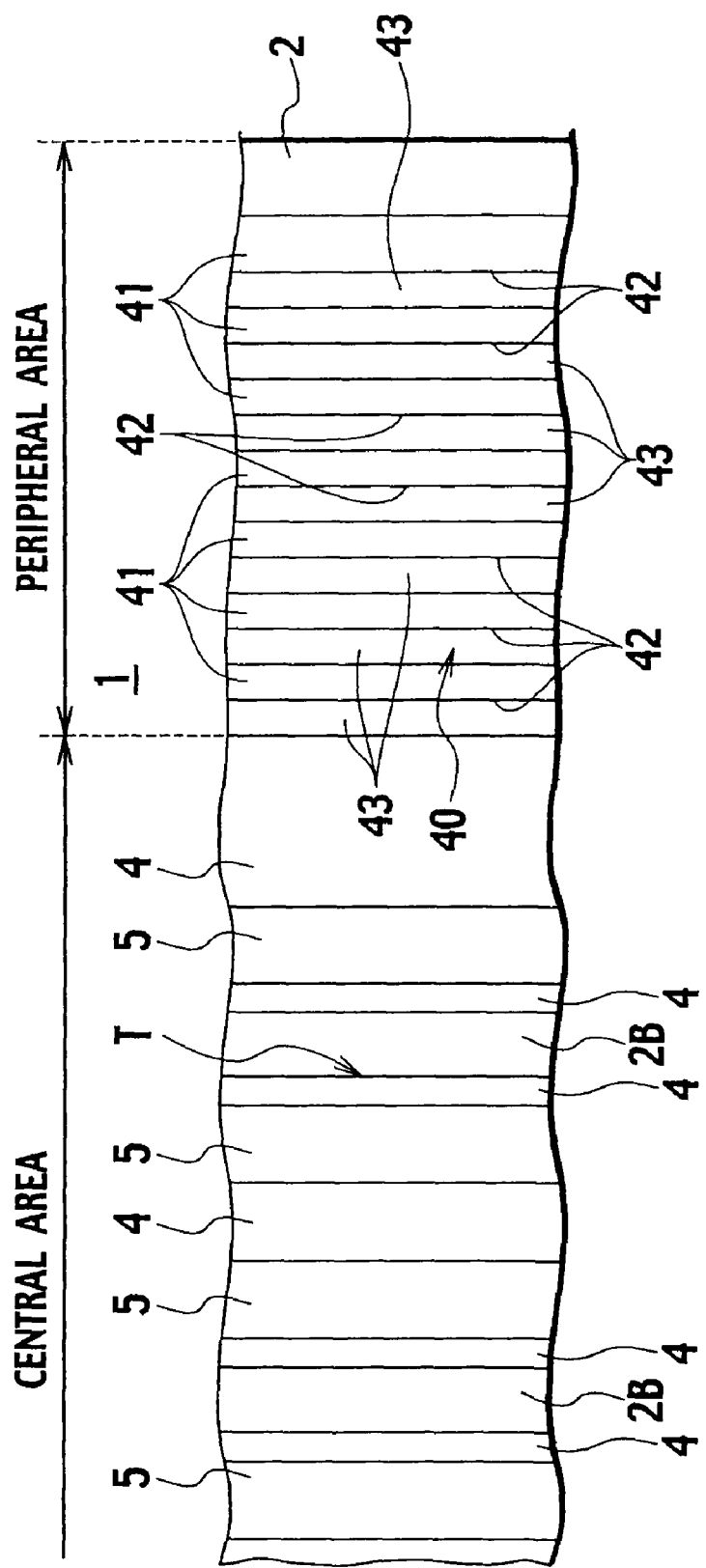
FIG. 11 is a top plan view of an essential part of a semiconductor device according to a second embodiment of the invention, describing a first planar structure.
Figure 15:
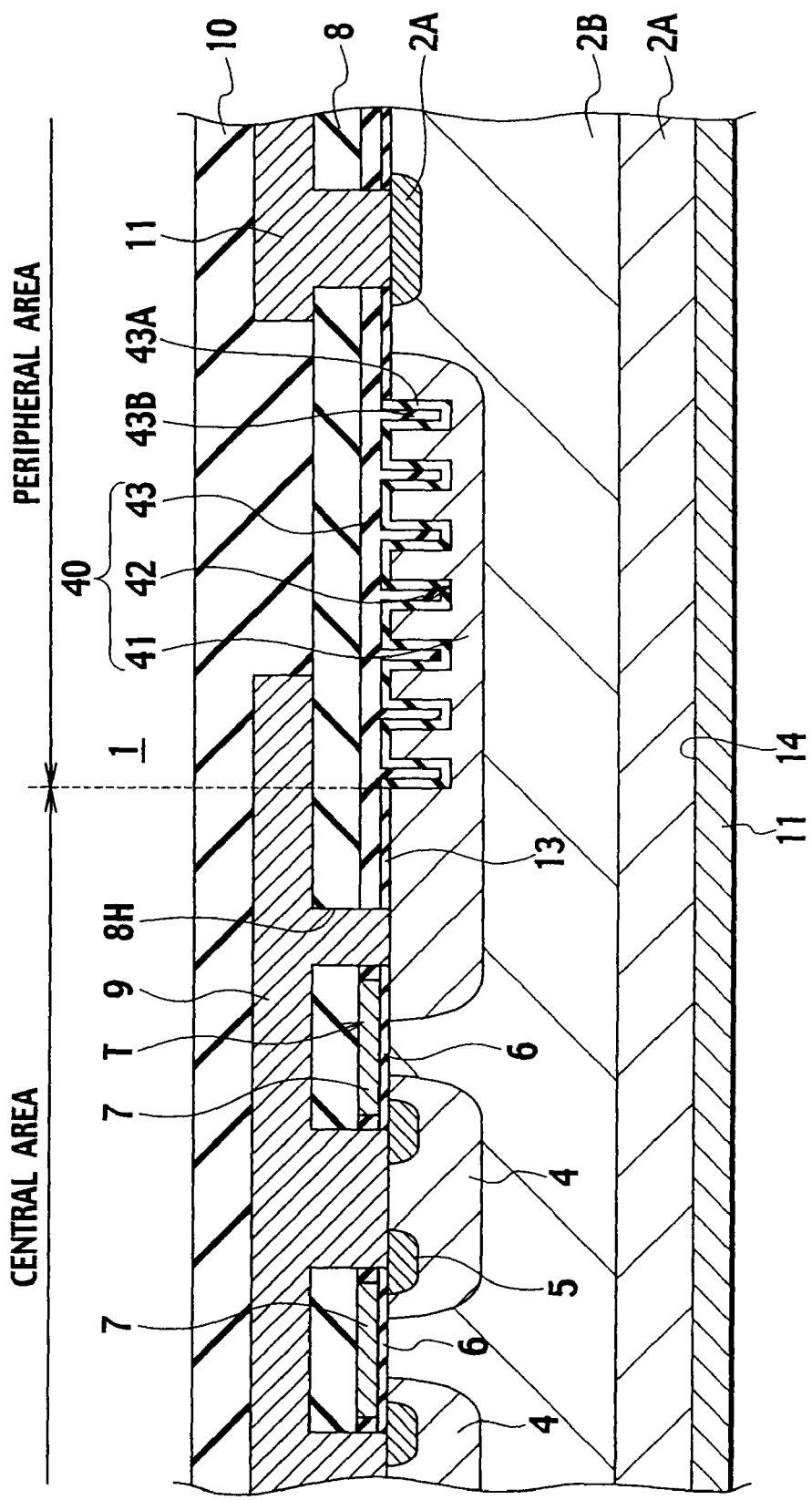
FIG. 15 is a cross sectional view of the essential part of a semiconductor device according to the second embodiment of the invention, describing the first planar structure.

Referring to FIG. 11 and FIG. 15, in the high withstand voltage section 40, a plurality of trenches 42 extend in the second direction which intersects with the first direction (laterally in FIG. 11) where the substrate 2 extends. In other words, the trenches 42 are in the shape of planar stripes, are narrow in the lateral direction and long in the longitudinal direction, and are arranged at certain intervals in the lateral direction. The first planar stripes of the trenches 42 in the second embodiment are turned by 90 degrees when compared with the planar strips of the trenches 42 in the first embodiment.

As long as a total amount of charges at the fourth semiconductor region 41 immediately under the trenches 42 and a total amount of charges at the first semiconductor region 2B immediately under the trenches 42, which has the pn junction with the fourth semiconductor region 41, are approximately equal in the high withstand voltage section 40, the trenches 42 are as effective as those in the first embodiment. The planar structure of the trenches 42 may be varied in any way.

[Second Planar Structure of High Withstand Voltage Section]

Figure 12:
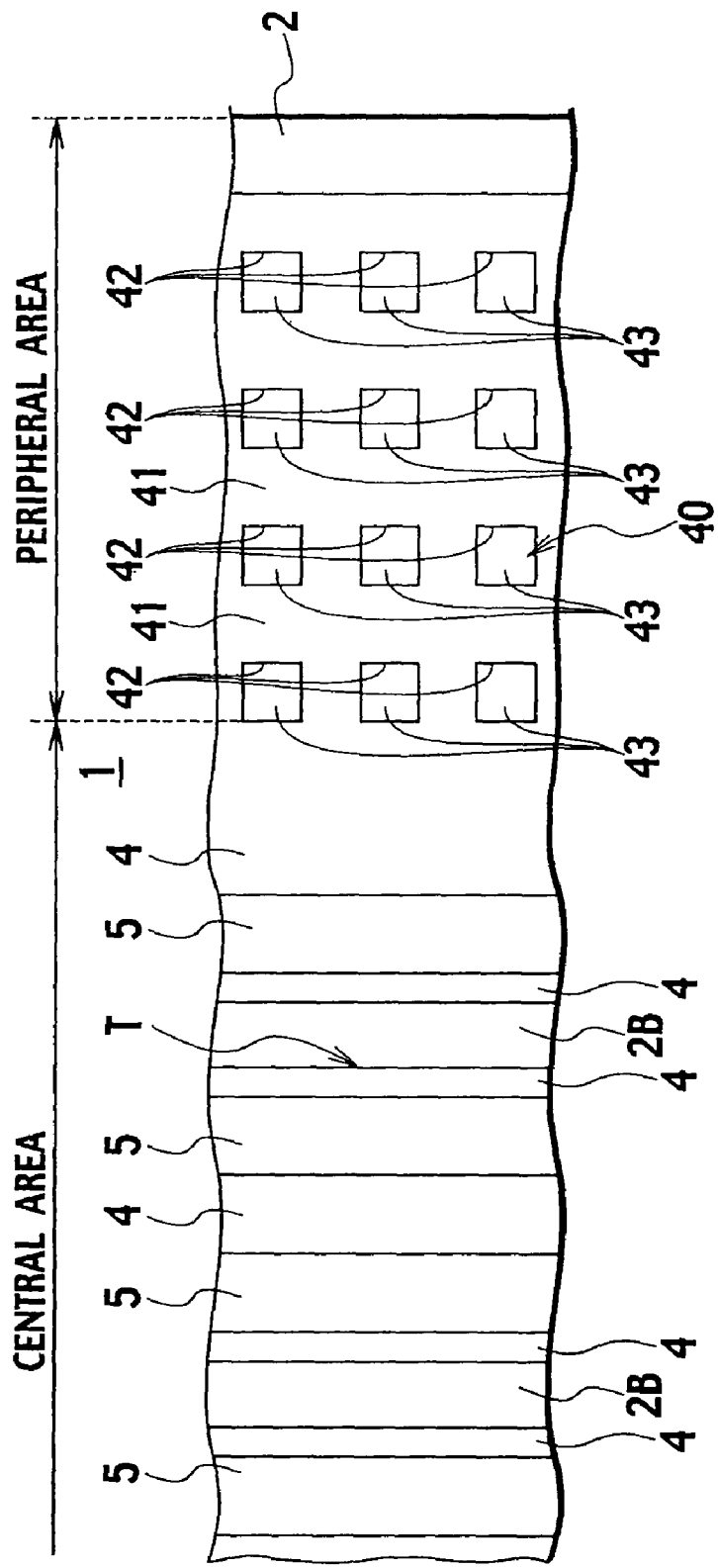
FIG. 12 is a top plan view of the essential part having a second planar structure.

Referring to FIG. 12, a plurality of trenches 42 are arranged in the first direction (laterally in FIG. 12) and also in the second direction (longitudinally in FIG. 12) at the high withstand voltage section 40 of the semiconductor device 1. A second planar structure of each trench 42 is square. In other words, a plurality of trenches 42 are dotted.

As long as a total amount of charges at the fourth semiconductor region 41 immediately under the trenches 42 and a total amount of charges at the first semiconductor region 2B, which has the pn junction with the fourth semiconductor region 41, are approximately equal in the high withstand voltage section 40, the planar structure of the trenches 42 may be varied in any way, e.g. may be in the shape of a rectangle, a circle, an oblong, or a polygon having five or more straight sides and angles. Such trenches 42 are as effective as those of the first practical example. Further, the trenches 42 are not always required to be placed in proper alignment, but may be aligned in zigzag.

[Third Planar Structure of High Withstand Voltage Section]

Figure 13:
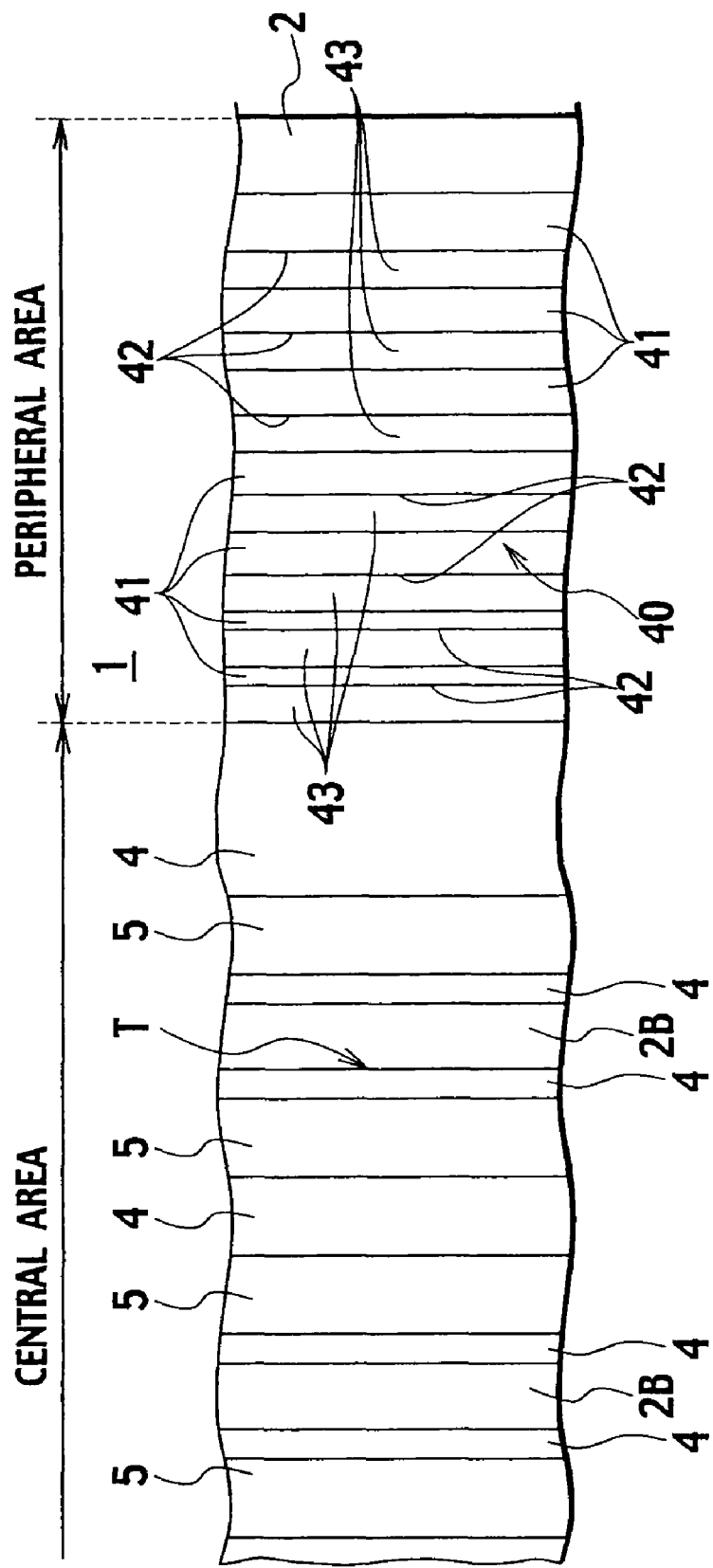
FIG. 13 is a top plan view of the essential part having a third planar structure.

Referring to FIG. 13, a high withstand voltage section 40 of the semiconductor device 1 is a modified version of the high withstand voltage section 40 shown in FIG. 11. Specifically, trenches 42 are arranged in a packed state near the central area of the substrate 2 (at the left side in FIG. 13) compared with those near the peripheral area of the substrate 2 (at the right side in FIG. 13). The packed arrangement of the trenches 42 can keep electric charges somewhat insufficient at the fourth semiconductor region 41 immediately under the trenches 42 at the central area of the substrate 2. Therefore, it is not necessary to perform the impurity diffusion two or more times in order to change a density of impurities in the RESURF layer. Further, an amount of charges at the high withstand voltage section 40 can be controlled simply by changing masks, which can be easily accomplished at a reduced cost. Spreading of the depletion layer can be also easily controlled at a reduced cost, which is effective in improving the performance of the high withstand voltage section 40. Still further, external ions, especially positive ions such as sodium ions, causing the metal contamination tend to gather not at the end of but at the center of the substrate 2 where the potential is substantially equal to that of the drain electrode 11. Even if external ions gather, the third planar structure of the high withstand voltage section 40 can suppress unbalancing of charges. In other words, it is possible to control lowering of the withstand voltage due to external ions.

In the planar structure shown in FIG. 13 and a fourth planar structure shown in FIG. 14 (to be described later), the high withstand voltage section 40 with the third planar structure and a high withstand voltage LDMOS (laterally diffused MOS) having the RESURF structure and the fourth planar structure (shown in FIG. 14) are applicable between the first semiconductor region (e.g. the source region) and the second semiconductor region (e.g. the drain region). Specifically, the high withstand voltage LDMOS includes: first and second semiconductor regions which are apart from each other and have the first conductivity; a third semiconductor region which is placed between the first and second semiconductor regions, is exposed on the main surface of the substrate, and has second electric conductivity opposite to the first conductivity; an electrode (e.g. a drain electrode) which is exposed on the main surface of the substrate outside the third semiconductor region; a fourth semiconductor region which is made under the same condition as that of the third semiconductor region, is placed between the second and first semiconductor regions, is exposed on the main surface of the substrate, and has the conductivity same as that of the third semiconductor region; and trenches which have a depth smaller than a junction depth of the main surface of the fourth semiconductor region.

If a high current is introduced, electric charges may be unbalanced in the high withstand voltage LDMOS, and operation high withstand voltage may be sometimes dropped. However, the amount of charges can be controlled depending upon the sparse state and packed state of trenches. In other words, when the high current is applied, the charge balances are adjusted, which is effective in improving the operation high withstand voltage of the high withstand voltage LDMOS.

The third planar structure may be used together with the foregoing second planar structure.

[Fourth Planar Structure of High Withstand Voltage Section]

Figure 14:
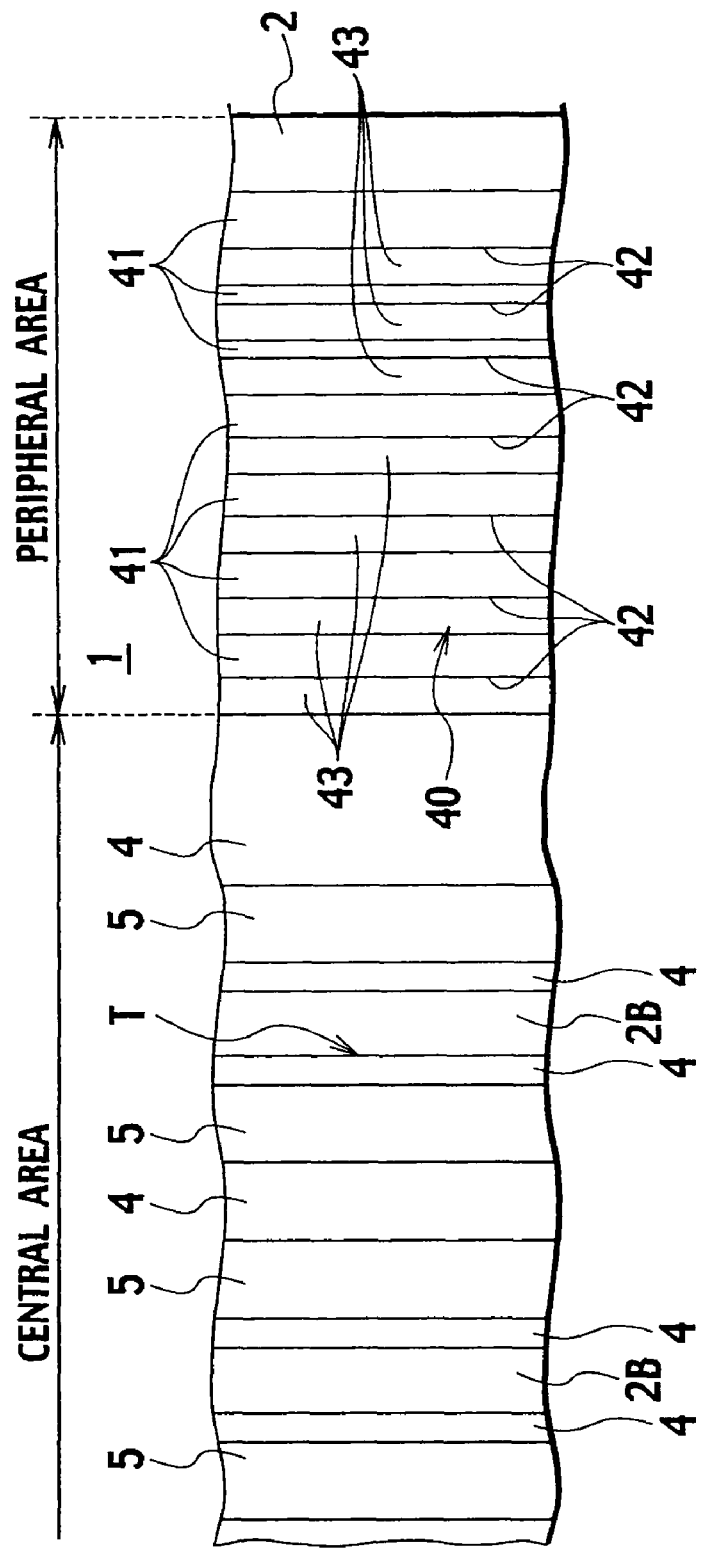
FIG. 14 is a top plan view of the essential part having a fourth planar structure.

Referring to FIG. 14, a high withstand voltage section 40 has a trench pattern opposite to that of the high withstand voltage section 40 shown in FIG. 13. Specifically, trenches 42 are packed near the peripheral area of the substrate (at the right side in FIG. 14) compared with those near the center of the substrate 2 (at the left side in FIG. 14).

The fourth planar structure may be used together with the foregoing second planar structure.

(Other Embodiment)

The invention has been described with reference to some embodiment. Obviously, modifications and alteration will occur to other upon reading and understanding the preceding detailed description. It is intended that the invention be construed as including all such modifications and alterations insofar they come within the scope of the appended claims or the equivalents thereof. For instance, the present invention is applicable to a semiconductor device provided with IGBTs.

Further, the interlayer dielectric 8 and the protective film 10 may be made of the same material. Further, the dielectric 43 may be dispensable from the trenches 42. The dielectric 43 may be a silicon nitride film, a low temperature insulant or the like as well as the silicon oxide film. Further, the dielectric 43 is not buried in the trenches 42 but is applied only onto the bottoms and inner surfaces of the trenches 42. The "trenches" also cover hollow space dug into the surfaces of the semiconductor regions. Further, throughout the embodiments, the fourth semiconductor region 41 may be provided as an extension of the third semiconductor region 4.

What is claimed is:

1. A semiconductor device formed on a substrate having a principal surface comprising:

a first semiconductor region and a second semiconductor region formed in the substrate, both the first semiconductor region and the second semiconductor region having a first conductive type;

a third semiconductor region of a second conductive type formed in the substrate and exposed on the principal surface, the third semiconductor region being interposed between the first semiconductor region and the second semiconductor region so as to electrically separate the second semiconductor region from the first semiconductor region and form a first junction with the first semiconductor region at a first junction depth receding from the principal surface;

a fourth semiconductor region of the second conductive type formed in the substrate, exposed on the principal surface and disposed apart from the third semiconductor region, the fourth semiconductor region having an electrical connection with the third semiconductor region and forming a second junction with the first semiconductor region at a second junction depth common with the first junction depth and having an impurity concentration common with the third semiconductor region;

a fifth semiconductor region formed in the substrate and out of the third semiconductor region and the fourth semiconductor region and exposed on the principal surface;

a first electrode in electrical contact with the fifth semiconductor region; and trenches within the fourth semiconductor region, the trenches having bottoms receding from the principal surface and shallower than the second junction depth.

2. The semiconductor device according to claim 1, wherein the trenches form one selected from the group of lines running parallel with the third semiconductor region and rows of dots arranged in parallel with the third semiconductor region.

3. The semiconductor device according to claim 1, further comprising: a second electrode so formed as to establish the electrical connection between the third semiconductor region and the fourth semiconductor region.

4. The semiconductor device according to claim 1, wherein a total amount of charges of the fourth semiconductor region under the trenches and a total amount of charges of the substrate under the trenches and at a longitudinal cross-sectional area of the substrate are equal.

5. The semiconductor device according to claim 1, wherein the fourth semiconductor region is disposed between the third semiconductor region and the fifth semiconductor region.

* * * * *

UNITED STATES PATENT AND TRADEMARK OFFICE
CERTIFICATE OF CORRECTION

PATENT NO. : 8,338,907 B2  
APPLICATION NO. : 13/355036  
DATED : December 25, 2012  
INVENTOR(S) : Hironori Aoki Page 1 of 1

It is certified that error appears in the above-identified patent and that said Letters Patent is hereby corrected as shown below:

On the title page, Item (73), should read:

Assignee: Sanken Electric Co., Ltd., Niiza-shi, (JP)

Signed and Sealed this  
Nineteenth Day of February, 2013

Teresa Stanek Rea  
*Acting Director of the United States Patent and Trademark Office*